United States Patent
Song

(10) Patent No.: US 9,361,958 B2
(45) Date of Patent: Jun. 7, 2016

(54) SEMICONDUCTOR DEVICE AND METHOD FOR OPERATING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 28 days.

(21) Appl. No.: 14/523,528

(22) Filed: Oct. 24, 2014

(65) Prior Publication Data

US 2015/0371691 A1    Dec. 24, 2015

(30) Foreign Application Priority Data

Jun. 18, 2014   (KR) .................. 10-2014-0074303

(51) Int. Cl.
*G11C 7/10* (2006.01)
*G11C 29/50* (2006.01)
*G11C 29/02* (2006.01)
*G11C 11/401* (2006.01)

(52) U.S. Cl.
CPC ............ *G11C 7/1084* (2013.01); *G11C 7/1048* (2013.01); *G11C 11/401* (2013.01); *G11C 29/02* (2013.01); *G11C 29/50* (2013.01); *G11C 2207/105* (2013.01); *G11C 2207/2254* (2013.01)

(58) Field of Classification Search
CPC ....... G11C 29/50; G11C 11/401; G11C 29/02
USPC ......................... 365/189.05, 230.08
See application file for complete search history.

(56) References Cited

U.S. PATENT DOCUMENTS

2005/0270856 A1* 12/2005 Earhart .................. G11B 27/11
                                                          365/189.05

FOREIGN PATENT DOCUMENTS

KR       1020090088488       8/2009

* cited by examiner

*Primary Examiner* — Jason Lappas
(74) *Attorney, Agent, or Firm* — IP & T Group LLP

(57) ABSTRACT

A semiconductor device may include: a plurality of data pads; a plurality of data buffers each suitable for buffering a signal inputted through a first input node using a voltage inputted through a second input node, and outputting the buffered signal; and a calibration control unit suitable for generating a test signal in a calibration mode, adjusting the level of the test signal, receiving outputs of the plurality of data buffers while adjusting the level of the test signal, and adjusting offsets of the data buffers such that the logical values of the outputs of the data buffers transit when the test signal has a target level.

15 Claims, 14 Drawing Sheets

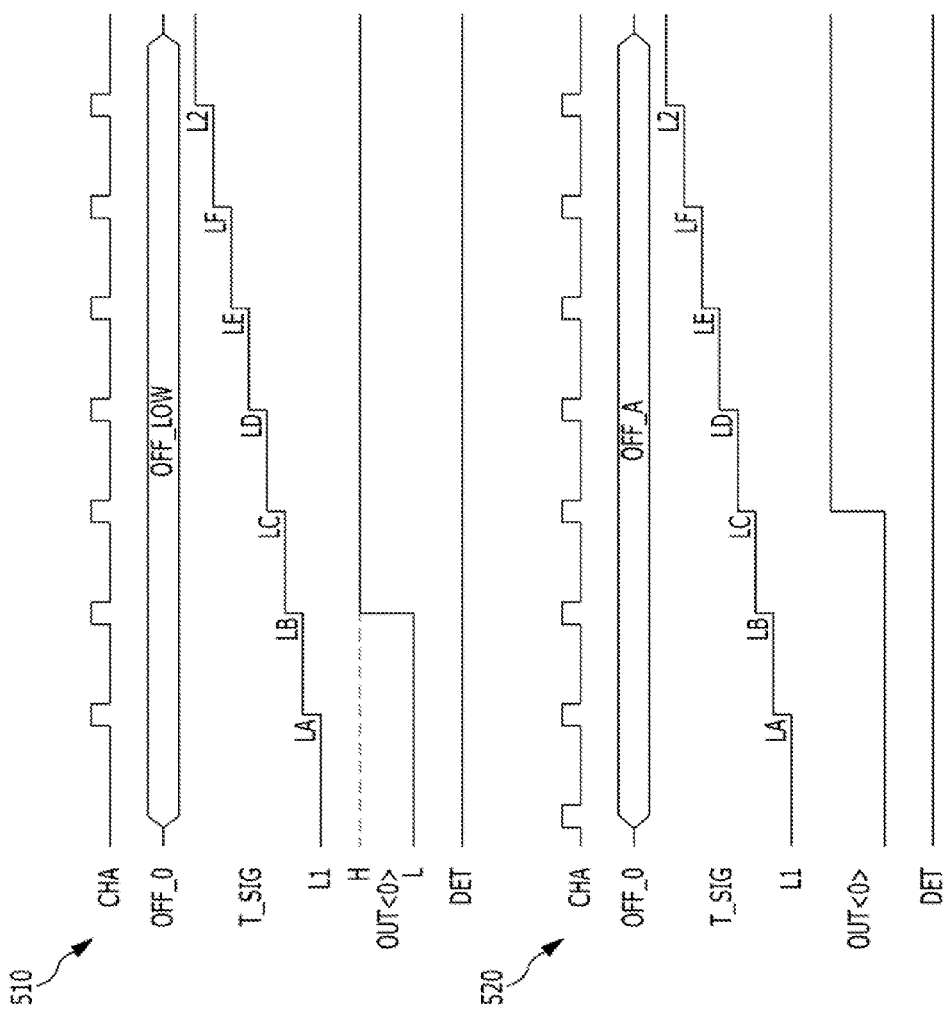

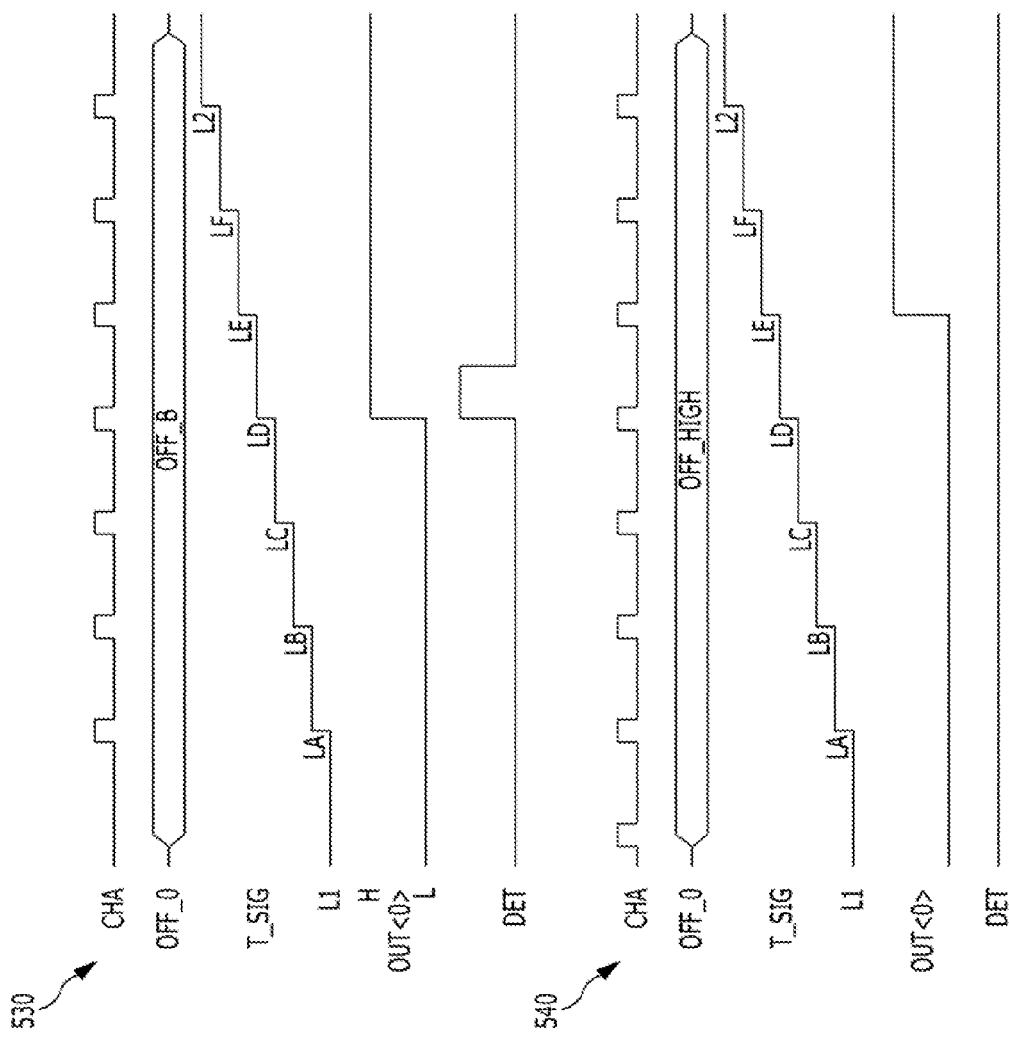

SEMICONDUCTOR DEVICE AND METHOD FOR OPERATING THE SAME

CROSS-REFERENCE TO RELATED APPLICATIONS

The present application claims priority of Korean Patent Application No. 10-2014-0074303, filed on Jun. 18, 2014, which is incorporated herein by reference in its entirety.

BACKGROUND

1. Field

This patent document relates to a semiconductor device and a method for operating the same.

2. Description of the Related Art

FIG. 1 is a block diagram illustrating a plurality of data pads DQ<0:N> and a plurality of data buffers 110_0 to 110_N which are included in a semiconductor device. The plurality of data buffers 110_0 to 110_N may buffer data inputted to the corresponding data pads and output the buffered data as outputs OUT<0:N>.

Each of the data buffers 110_0 to 110_N receives data from the corresponding data pad through a first input terminal IN1, receives a reference voltage VREF through a second input terminal IN2, buffers the data of the corresponding data pad using the reference voltage VREF, and outputs the buffered data. Each of the data buffers 110_0 to 110_N outputs a high signal when the voltage of the corresponding data pad (hereafter, referred to as input voltage) is higher than the reference voltage and outputs a low signal when the input voltage is lower than the reference voltage VREF. That is, the output of each of the data buffers 110_0 to 110_N has a logical value which varies with reference to the reference voltage VREF. Each of the data buffers 110_0 to 110_N includes a differential amplifier may amplify the difference between two input signals.

In general, semiconductor circuits including differential amplifiers in data buffers have offsets which occur due to errors in design, the semiconductor fabrication process, packaging errors, or the external environment. Because of offsets in differential amplifiers, the output of the data buffer varies with reference to an incorrect voltage, as opposed to the correct reference voltage VREF. For example, the output of the data buffer may vary with reference to an erroneous voltage level that is higher than the reference voltage VREF, or vary with reference to an erroneous voltage that is lower than the reference voltage VREF. The variation in the output of the data buffer depends on the magnitude of the offset, and the offsets of the differential amplifiers may be different from one another.

FIG. 2 is a diagram illustrating the problem of the semiconductor device of FIG. 1.

FIG. 2 illustrates the input ranges R_0 to R_N of data corresponding to the maximum margin that the plurality of data buffers 110_0 to 110_N can have. The data inputted to the respective data pads DQ<0:N> have the same swing SW.

In order to obtain the maximum margin, the reference level of each of the data buffers 110_0 to 110_N must be positioned in the center of the input range R_0 to R_N of the data inputted to the data buffer. The reference level indicates the reference level of an input voltage, at which an output of the data buffer transits. For example, when the reference level of a specific data buffer is X[V] and the swing of data inputted to the specific data buffer is Y[V], the input range of the corresponding data must be set to X±Y/2 [V].

As illustrated in FIG. 2, the plurality of data buffers 110_0 to 110_N have various reference levels RL_0 to RL_N different from the ideal reference voltage level VREF due to offsets. Thus, the input range of data in which the maximum margin can be obtained may differ for each of the data buffers 110_0 to 110_N. The semiconductor device uses the reference voltage VREF to buffer data. In order to prevent failures of the data inputted through the data buffers 110_0 to 110_N, the data inputted to the semiconductor device must be included commonly in the input ranges of all the data buffers 110_0 to 100_N with reference to the reference voltage VREF. Thus, the data inputted through the data buffers 110_0 to 110_N may have a common range CR. The common range CR has a smaller value than the swing SW of the data. This is, due to an offset difference between the respective data buffers 110_0 to 110_N, the data input margin of the semiconductor device may be reduced.

SUMMARY

Various embodiments are directed to a semiconductor device capable of adjusting offsets of a plurality of data buffers such that the data buffers have the same reference level, thereby maximizing the margin of input data, and a method for operating the same.

In an embodiment, a semiconductor device may include: a plurality of data pads; a plurality of data buffers each suitable for buffering a signal inputted through a first input node using a voltage inputted through a second input node, and outputting the buffered signal; and a calibration control unit suitable for generating a test signal in a calibration mode, adjusting the level of the test signal, receiving outputs of the plurality of data buffers while adjusting the level of the test signal, and adjusting offsets of the data buffers such that the logical values of the outputs of the data buffers transit when the test signal has a target level. Data of the corresponding data pad may be inputted to the first input node, and a reference voltage may be inputted to the second input node. In the calibration mode, the test signal may be inputted to the first input node, and a test voltage may be applied to the second input node.

In an embodiment, a semiconductor device may include: a plurality of data pads; a plurality of data buffers each suitable for buffering a signal inputted through a first input node using a voltage inputted through a second input node, and outputting the buffered signal; a plurality of driving units suitable for pull-up driving or pull-down driving output nodes of the plurality of data buffers in response to the outputs of the plurality of data buffers, respectively; and a calibration control unit suitable for generating a test signal in a calibration mode, adjusting the level of the test signal, receiving outputs of the plurality of driving units while adjusting the level of the test signal, and adjusting drivabilities of the plurality of driving units such that the logical values of the outputs of the plurality of driving units transit when the test signal has a target level. Data of the corresponding data pad may be inputted to the first input node, and a reference voltage may be applied to the second input. In the calibration mode, the test signal may be inputted to the first input node, and a test voltage may be applied to the second input node.

In an embodiment, there is provided a method for operating a semiconductor device which includes a plurality of data buffers. The method may include: inputting a test signal to first input nodes of the plurality of data buffers, inputting a test voltage to second input nodes of the data buffers, adjusting the level of the test signal, receiving outputs of the data buffers, and adjusting offsets of the data buffers such that the logical values of the outputs of the data buffers transit when the test signal has a target level; receiving data through the plurality of data pads; and inputting data of the corresponding data pads to the first input nodes of the data buffers, inputting a reference voltage to the second input nodes of the data buffers, and buffering the data of the corresponding data pads using the reference voltage.

In an embodiment, there is provided a method for operating a semiconductor device which includes a plurality of data buffers and a plurality of driving units suitable for pull-up driving or pull-down driving output nodes of the plurality of data buffers in response to outputs of the plurality of data buffers, respectively. The method may include: inputting a test signal to first input nodes of the plurality of data buffers, inputting a test voltage to second input nodes of the data buffers, adjusting the level of the test signal, receiving voltages of the output nodes of the data buffers, and adjusting drivabilities of the plurality of driving units such that the logical values of voltages of the output nodes of the data buffers transit when the test signal has a target level; receiving data through the plurality of data pads; inputting data of the corresponding data pads to the first input nodes of the data buffers, inputting a reference voltage to the second input nodes of the data buffers, and buffering the data of the corresponding data pads using the reference voltage; and driving the output nodes of the data buffers in response to outputs of the data buffers, respectively.

BRIEF DESCRIPTION OF THE DRAWINGS

FIGS. 5A and 5B are timing diagrams illustrating a calibration operation of the semiconductor device of FIG. 3.

DETAILED DESCRIPTION

Figure 1:
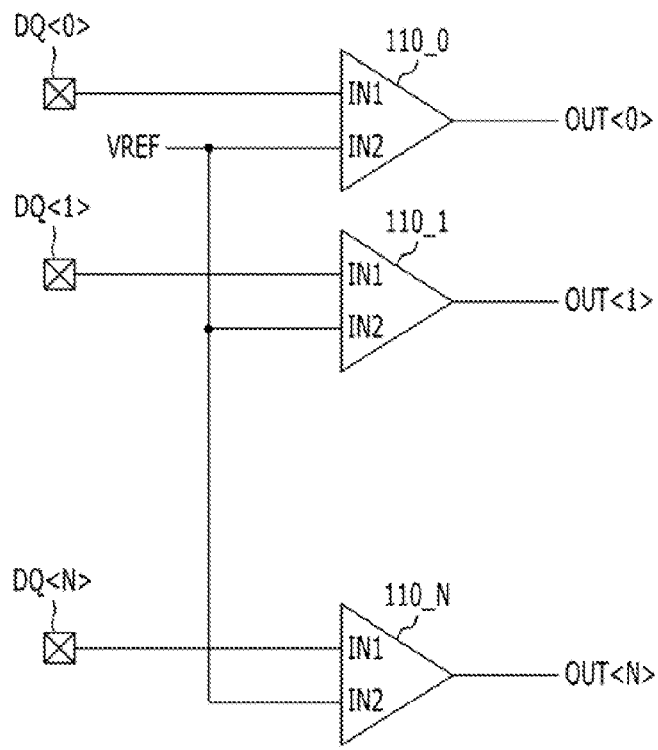
FIG. 1 is a block diagram illustrating a plurality of data pads and a plurality of data buffers included in a semiconductor device.
Figure 2:
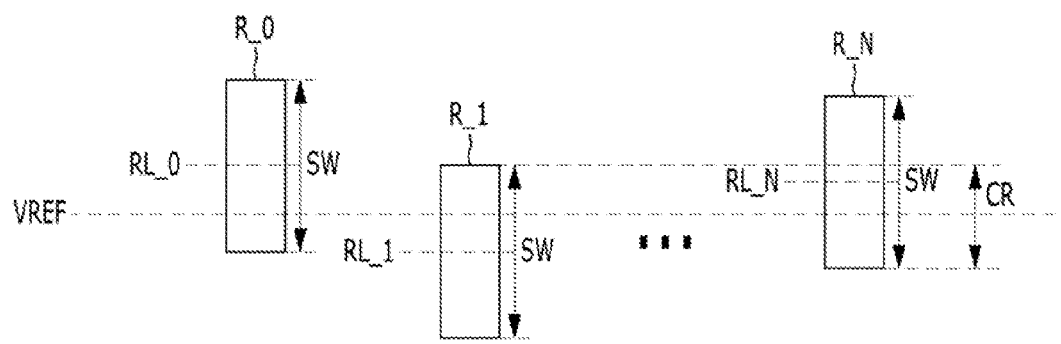
FIG. 2 is a diagram illustrating a problem of the semiconductor device of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
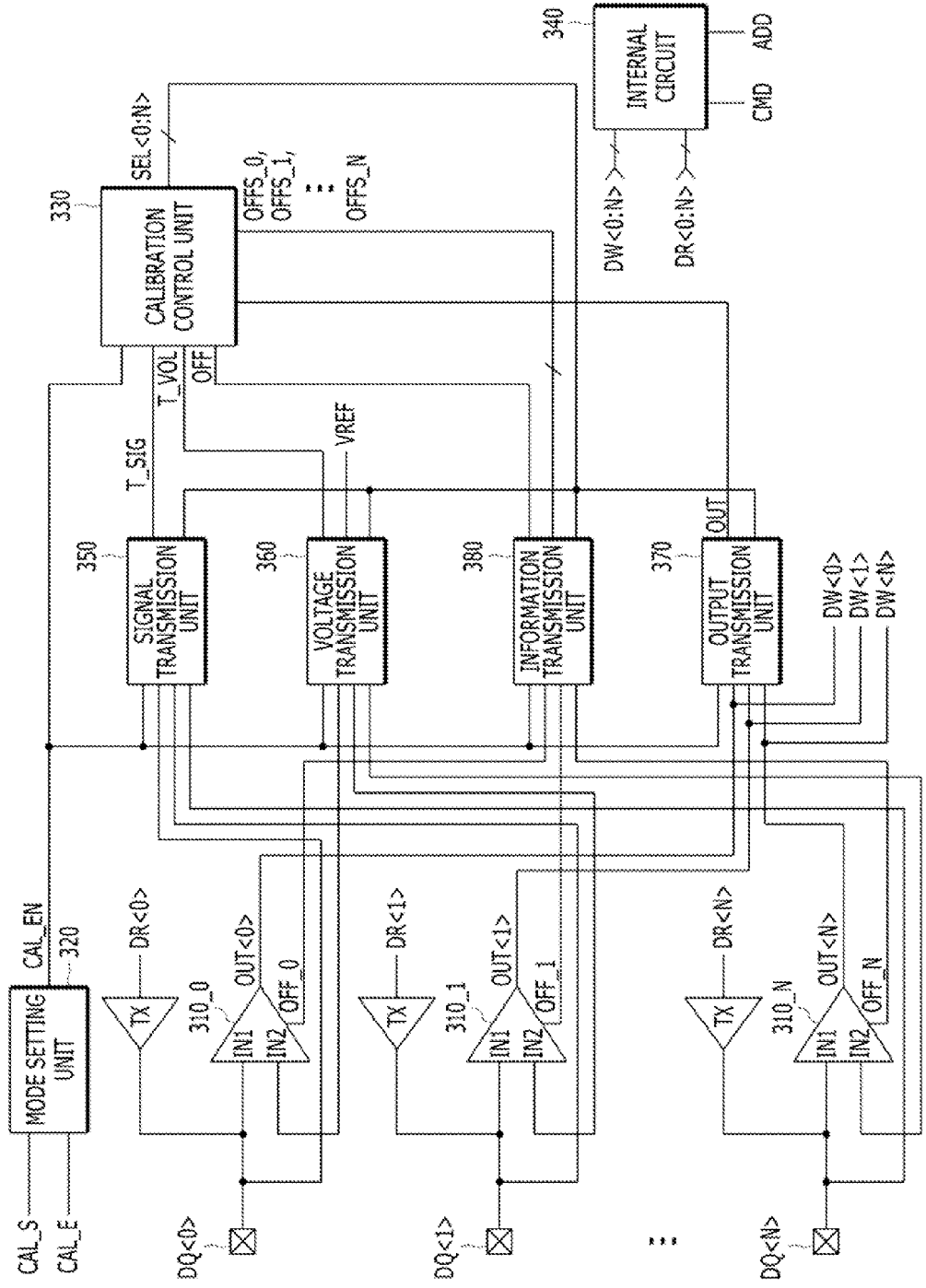
FIG. 3 is a block diagram illustrating a semiconductor device in accordance with an embodiment of the present invention.

FIG. 3 is a block diagram illustrating a semiconductor device in accordance with an embodiment of the present invention.

As illustrated in FIG. 3, the semiconductor device may include a plurality of data pads DQ<0:N>, a plurality of data buffers 310_0 to 310_N, a mode setting unit 320, a calibration control unit 330, a plurality of transmitters TX, and an internal circuit 340. Furthermore, the semiconductor device may include a signal transmission unit 350, a voltage transmission unit 360, an output transmission unit 370, and an information transmission unit 380.

Referring to FIG. 3, the semiconductor device will be described.

The plurality of data pads DQ<0:N> may transfer data between an external device and the semiconductor device. The semiconductor device may operate according to control of a controller (not illustrated in FIG. 3), and may receive data outputted from the controller through the plurality of data pads DQ<0:N>, and output data to the controller through the plurality of data pads DQ<0:N>.

Each of the data buffers 310_0 to 310_N may include a first input node IN1 and a second input node IN2. Each of the data buffers 310_0 to 310_N may buffer and output a signal inputted to the first input node IN1 using a voltage inputted to the second input node IN2. More specifically, each of the data buffers 310_0 to 310_N may output a logical value varying according to the relation between a reference level and the level of the signal inputted to the first input node IN1. Hereafter, the signal inputted to the first input node IN1 is referred to as an input signal IN1. Each of the data buffers 310_0 to 310_N may output a first logical value, for example, low, when the level of the input signal IN1 is lower than the reference level, and output a second logical value, for example, high, when the level of the input signal IN1 is higher than the reference level.

The respective data buffers 310_0 to 310_N may have different offsets, each of which is positive or negative. When the level of a voltage inputted to the second input node IN2 of a specific data buffer is represented by V2 and the magnitude of the offset is represented by ΔV, the erroneous reference level may be V2+ΔV when the corresponding data buffer has a positive offset, and V2−ΔV when the corresponding data buffer has a negative offset. Thus, the erroneous reference levels of the respective data buffers 310_0 to 310_N may differ from each other before calibration. For reference, the offset of the data buffer may correspond to a difference between the level of the voltage inputted to the second input node IN2 and the level of the voltage inputted to the first input node IN1 when the logical value of the output of the data buffer transits.

The offsets of the data buffers 310_0 to 310_N may be adjusted in response to corresponding pieces of offset information OFF_0 to OFF_N. Each piece of offset information OFF_0 to OFF_N may include a multi-bit signal. Alternatively, each piece of offset information OFF_0 to OFF_N may include an analog signal having various levels. The offset of each of the data buffers 310_0 to 310_N may increase when the value (or level) of the corresponding offset information increases, and decrease when the value (or level) of the offset information decreases. On the other hand, the offset may decrease when the value (or level) of the corresponding offset information increases, and increase when the value (or level) of the offset information decreases.

The mode setting unit 320 may activate a calibration signal CAL_EN when a calibration start signal CAL_S is activated, and deactivate the calibration signal CAL_EN when a calibration end signal CAL_E is activated. When the calibration signal CAL_EN is activated, the semiconductor device may be set to a calibration mode.

During the calibration period, the calibration control unit 330 may generate a test signal T_SIG and a test voltage T_VOL, receive outputs of the data buffers 310_0 to 310_N while adjusting the level of the test signal T_SIG, and adjust offsets of the data buffers 310_0 to 310_N such that the logical values of the outputs of the data buffers 310_0 to 310_N transit when the test signal T_SIG corresponds to a target level. The offset when the test signal T_SIG corresponds to the target level and the logical values at which the outputs of the data buffers 310_0 to 310_N transit may be referred to as the target offset. The calibration control unit 330 may adjust the values of the offset information applied to the respective data buffers 310_0 to 310_N, in order to adjust the offsets of the data buffers 310_0 to 310_N. When the calibration operation is completed, the offsets or reference levels of the respective data buffers 310_0 to 310_N may be equalized. The calibration control unit 330 may sequentially adjust the offsets of the data buffers 310_0 to 310_N, and store the offset information when the offsets of the respective data buffers 310_0 to 310_N become the target offset. The stored offset information OFFS_0 to OFFS_N may be inputted to the corresponding data buffers 310_0 to 310_N.

The plurality of transmitters TX may output data DR<0:N> transmitted from the internal circuit 340 of the semiconductor device to the corresponding data pads DQ<0:N>. The internal circuit 340 may include a circuit which performs specific operations of the semiconductor device using a command CMD, an address ADD, and data inputted from outside. For example, when the semiconductor device is a semiconductor memory device, the internal circuit 340 may include a plurality of memory cells (not illustrated in FIG. 3) for storing data and a peripheral circuit for accessing the plurality of memory cells (writing or reading data to or from the memory cells). When a write command CMD is applied from outside, the internal circuit 340 may write the data DW<0:N> to memory cells corresponding to an address ADD, and when a read command CMD is applied from outside, the internal circuit 340 may read the data DR<0:N> of the memory cells corresponding to the address ADD.

The signal transmission unit 350 may transmit the test signal T_SIG to the first input node IN1 of a selected one of the data buffers 310_0 to 310_N when the calibration signal CAL_EN is activated. The voltage transmission unit 360 may transmit the test voltage T_VOL to the second input node IN2 of the selected one of the data buffers 310_0 to 310_N when the calibration signal CAL_EN is activated, and transmit the reference voltage VREF to the second input nodes IN2 of all the data buffers 310_0 to 310_N when the calibration signal CAL_EN is deactivated. The output transmission unit 370 may transmit an output OUT of the selected one of the data buffers 310_0 to 310_N to the calibration control unit 330 when the calibration signal CAL_EN is activated. The information transmission unit 380 may transmit information OFF to the selected one of the data buffers 310_0 to 310_N when the calibration signal CAL_EN is activated. Furthermore, the information transmission unit 380 may transmit the pieces of offset information OFFS_0 to OFFS_N to the plurality of data buffers 310_0 to 310_N, respectively, when the calibration signal CAL_EN is deactivated.

Based on the above-described configuration, the operations of the semiconductor device will be described.

When the semiconductor device enters the calibration mode, that is, the calibration signal CAL_EN is activated, the calibration control unit 330 may sequentially select the plurality of data buffers 310_0 to 310_N, and adjust offsets of the selected one of the data buffers 310_0 to 310_N. For reference, the calibration control unit 330 may select one of the data buffers 310_0 to 310_N corresponding to one among a plurality of select signals SEL<0:N>. Hereafter, the case in which the first data buffer 310_0 is selected will be described. In this case, the first select signal SEL<0> among the plurality of select signals SEL<0:N> may be activated.

While calibrating the offset, or sequentially changing the offset information OFF, the calibration control unit 330 may sequentially change the level of the test signal T_SIG at a predetermined interval from a first level to a second level whenever the offset of the first data buffer 310_0 of the data buffers 310_0 to 310_N is changed. For reference, the first level and the second level may correspond to the lowest level and the highest level of the test signal T_SIG, respectively, and vise versa.

The calibration control unit 330 may receive an output OUT<0> of the first data buffer 310_0 of the data buffers 310_0 to 310_N while changing the level of the test signal T_SIG. The calibration control unit 330 may change the offset information OFF when the level of the test signal T_SIG reaches the second level, and receive the output OUT<0> of the first data buffer 310_0 of the data buffers 310_0 to 310_N while sequentially changing the level of the test signal T_SIG at a predetermined interval from the first level to the second level. The above-described process may be repeated until the offset of the first data buffer 310_0 of the data buffers 310_0 to 310_N becomes the target offset.

When the offset information OFF having a specific value is applied through the above-described process, the logical value of the output OUT<0> of the first data buffer 310_0 of the data buffers 310_0 to 310_N may transit when the level of the test signal T_SIG is at the target level. In this case, the calibration control unit 330 may store the offset corresponding to the target level as offset information OFFS_0. The calibration control unit 330 may store the offset Information OFFS_0 to OFFS_N for equalizing the offsets (or reference levels) of the data buffers 310_0 to 310_N through the above-described process. For reference, before the offset adjustment, the initial offsets of the respective data buffer 310_0 to 310_N may differ from each other. Thus, after the offset adjustment is completed, the values of the stored offset information OFFS_0 to OFFS_N for each of the data buffers 310_0 to 310_N may differ from one another.

When the calibration is completed, the pieces of offset Information OFFS_0 to OFFS_N may be inputted to the data buffers 310_0 to 310_N, respectively, and the offsets of the respective data buffers 310_0 to 310_N may be equally adjusted. During the data input operation, the data of the corresponding data pads DQ<0:N> may be inputted to the first input nodes IN1 of the data buffers 310_0 to 310_N, and the reference voltage VREF may be inputted to the second input nodes IN2 of the data buffers 310_0 to 310_N. Thus, the reference levels of the respective data buffers 310_0 to 310_N may be equalized.

The semiconductor device in accordance with the embodiment of the present invention may adjust the offsets (or reference levels) of the data buffers 310_0 to 310_N to the same value through the calibration before receiving data, thereby maximizing the margin of the data inputted to the semiconductor device.

Figure 4:
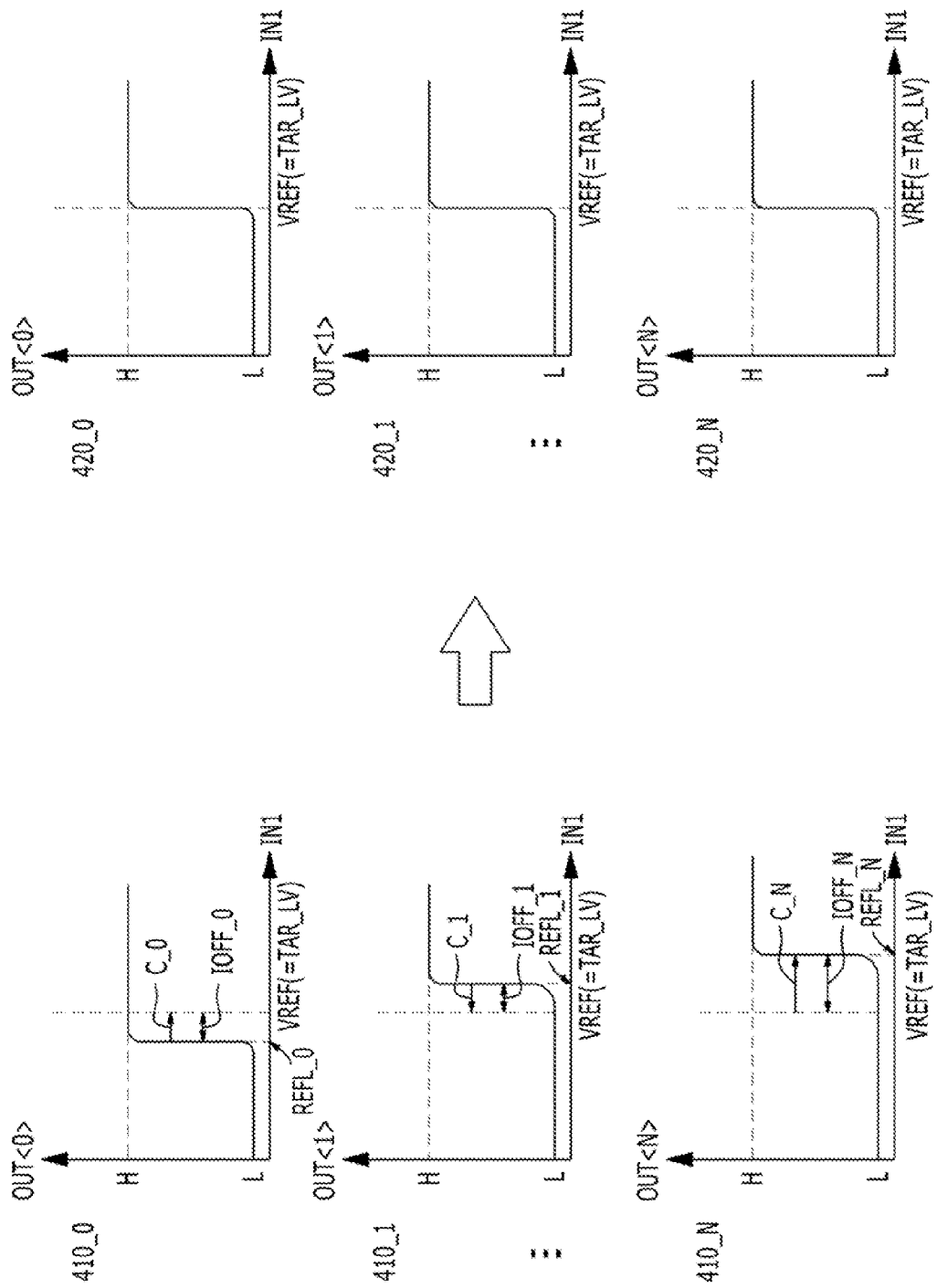
FIG. 4 is a diagram illustrating adjustment of offsets of a plurality of data buffers.

FIG. 4 is a diagram illustrating adjustment of the offsets of the data buffers 310_0 to 310_N.

FIG. 4 illustrates the change in logical value of the output of each of the data buffers 310_0 to 310_N with respect to the change in the level of the input signal IN1. FIG. 4 shows first graphs 410_0 to 410_N indicating the relationship between the input signals IN1 and the outputs OUT<0:N> of the data buffers 310_0 to 310_N before calibration is performed, and second graphs 420_0 to 420_N indicating the relationship between the input signals IN1 and the outputs OUT<0:N> of the data buffers 310_0 to 310_N after the calibration is completed. The logical values of the outputs OUT<0:N> of the data buffers 310_0 to 310_N are low L when the level of the input signal IN1 is lower than the reference level, and high H when the level of the input signal IN1 is higher than the reference level.

As illustrated in the first graphs 410_0 to 410_N, the plurality of data buffers 310_0 to 310_N may have different offsets IOFF_0 to IOFF_N before the offsets are adjusted. Thus, although the reference voltages VREF having the same level are applied to the second input nodes IN2, the erroneous reference levels REFL_0 to REFL_N of the respective data buffers 310_0 to 310_N are different from each other. Through calibration, the offsets IOFF_0 to IOFF_N of each of the data buffers 310_0 to 310_N may be increased or decreased (C_0 to C_N). For reference, the notation TAR_LV in FIG. 4 may represent the target level.

As illustrated in the second graphs 410_0 to 410_N, the offsets IOFF_0 to IOFF_N of the data buffers 310_0 to 310_N may be equalized to each other when the calibration is completed. Thus, when the reference voltages VREF having the same level are applied to the second input nodes IN2, the erroneous reference levels REFL_0 to REFL_N of the respective data buffers 310_0 to 310_N may be equalized to the target level TAR_LV. For reference, the magnitudes of the offsets IOFF_0 to IOFF_N may be adjusted to zero through the calibration.

FIGS. 5A and 5B are timing diagrams illustrating the calibration operation of the semiconductor device of FIG. 3.

During the calibration operation, the test signal T_SIG may be sequentially changed at a predetermined interval from the first level L1 to the second level L2, and the offset information OFF may be sequentially changed at a predetermined interval from an offset value OFF_LOW for minimizing the offset to an offset value OFF_HIGH for maximizing the offset. A change signal CHA may be periodically activated in the calibration mode, and the level of the test signal T_SIG may be changed in response to the change signal CHA. Hereafter, the operation of calibrating the offset of the first data buffer 310_0 will be described. For reference, suppose that the target level is positioned between 'LC' and 'LD'.

Referring to the diagram 510 of FIG. 5A, when the calibration operation is started, the offset value OFF_LOW may be applied to the first data buffer 310_0. Whenever the change signal CAH is activated after the offset value OFF_LOW is applied, the level of the test signal T_SIG may sequentially increase from the first level L1 to the second level L2. Since the output OUT<0> of the first data buffer 310_0 is maintained at the low level L during the levels 'L1' and 'LA' of the test signal T_SIG and transits to the high level at the level 'LB' of the test signal T_SIG, the reference level of the first data buffer 310_0 may become a level between the levels 'LA' and 'LB' of the test signal T_SIG when the offset information OFF is the offset value OFF_LOW.

Referring to the diagram 520 of FIG. 5A, when the level of the test signal T_SIG reaches the second level L2, the offset value OFF applied to the first data buffer 310_0 may be changed to an offset value OFF_A. Then, whenever the change signal CAH is activated, the level of the test signal T_SIG may sequentially increase from the first level L1 to the second level L2. Since the output OUT<0> of the first data buffer 310_0 is maintained at the low level L between the levels 'L1' and 'LB' of the test signal T_SIG, and transits to the high level H at the level 'LC' of the test signal T_SIG, the reference level of the first data buffer 310_0 may be between the levels 'LB' and 'LC' of the test signal T_SIG when the offset information OFF is the offset value OFF_A.

Similarly, referring to the diagram 530 of FIG. 5B, the value of the offset information OFF may be changed to an offset value OFF_B, and the level of the test signal T_SIG may sequentially increase from the first level L1 to the second level L2. As illustrated in FIG. 5B, the output OUT<0> transits between the levels 'LC' and 'LD' of the test signal T_SIG, and the target level is positioned between the levels 'LC' and 'LD' of the test signal T_SIG as supposed. Thus, a detection signal DET may be activated. When the detection signal DET is activated, the offset value OFF_B may be stored. Finally, the value of the offset information OFF may be changed to the offset value OFF_HIGH, and the above-described process may be repeated. The output OUT<0> may transit between the levels 'LD' and 'LE' of the test signal T_SIG.

When the offset adjustment for the first data buffer 310_0 is completed, the offset of the second data buffer 310_1 may be adjusted. The process may be performed in the same manner as described above. When the offset adjustment for all the data buffers 310_0 to 310_N is completed, the calibration may be ended, and the pieces of offset information OFF_0 to OFF_N respectively corresponding to the data buffers 310_0 to 310_N may be stored.

Figure 6:
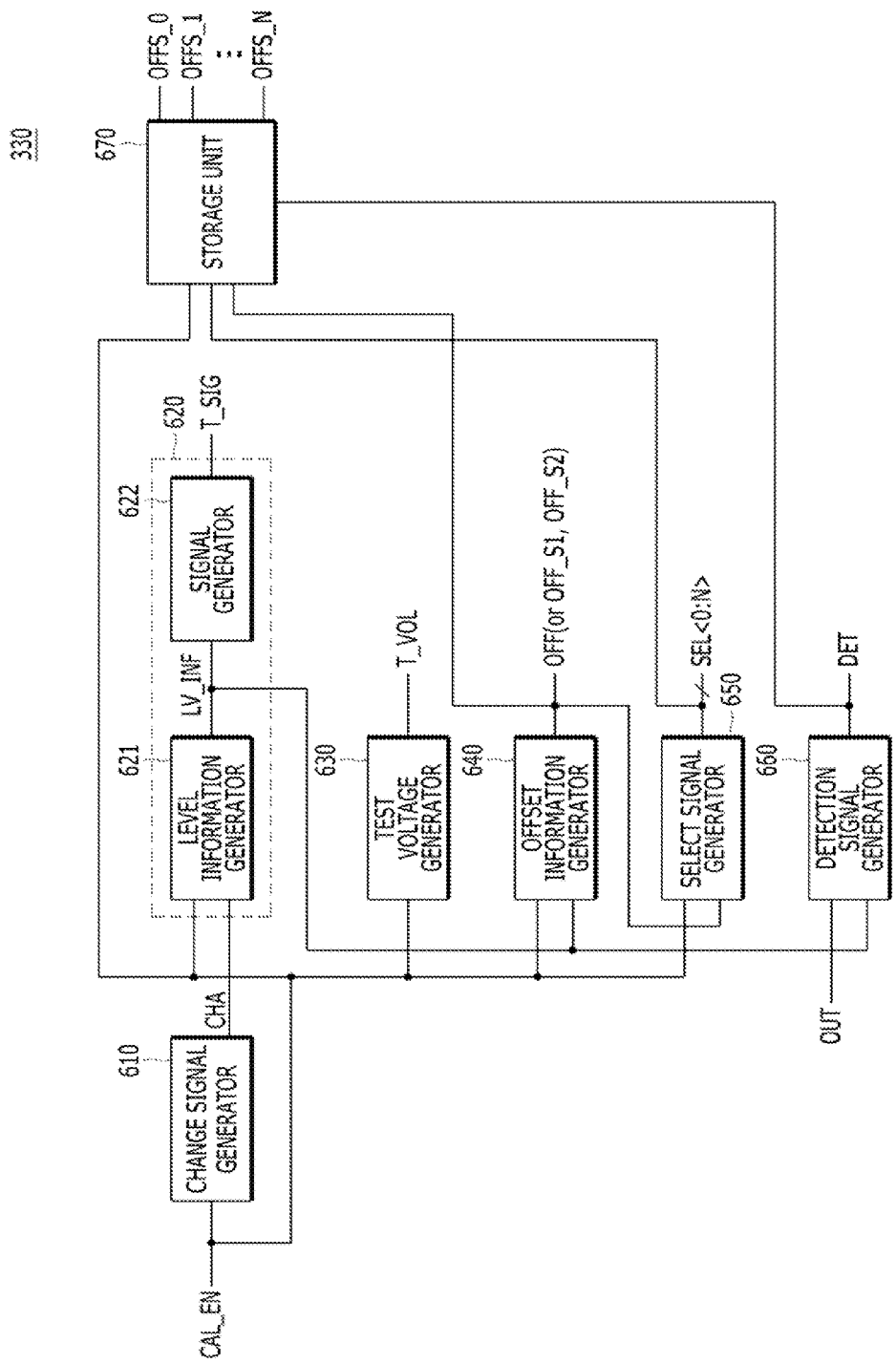
FIG. 6 is a block diagram illustrating a calibration control unit shown in FIG. 3.

FIG. 6 is a block diagram illustrating the calibration control unit 330 shown in FIG. 3.

As illustrated in FIG. 6, the calibration control unit 330 may include a change signal generator 610, a test signal generator 620, a test voltage generator 630, an offset information generator 640, a select signal generator 650, a detection signal generator 660, and a storage unit 670.

Referring to FIGS. 3 to 6, the calibration control unit 330 will be described.

The change signal generator 610 may periodically activate the change signal CHA during activation of the calibration signal CAL_EN. For this operation, the change signal generator 610 may include an oscillator which is enabled during activation of the calibration signal CAL_EN.

The test signal generator 620 may generate the test signal T_SIG during activation of the calibration signal CAL_EN, and sequentially change the level of the test signal T_SIG at a predetermined interval from the first level to the second level in response to the change signal CHA. When the level of the test signal T_SIG reaches the second level, the test signal generator 620 may change the level of the test signal T_SIG to the first level, and then sequentially change the level of the test signal T_SIG up to the second level. For this operation, the test signal generator 620 may include a level information generator 621 and a signal generator 622.

The level information generator 621 may generate level information LV_INF, change the level information LV_INF whenever the change signal CHA is activated, and change the level information LV_INF to the initial value when the level information LV_INF reaches the end value. For example, when the level information LV_INF is a 3-bit signal and has an initial value of '000' and an end value of '111', the level information generator 621 may sequentially change the level information LV_INF from '000' to '001', '010', '011', '100', '101', '110', and '111'. The signal generator 622 may generate the test signal T_SIG having a level corresponding to the level information LV_INF. The signal generator 622 may increase the level of the test signal T_SIG as the binary value of the level information LV_INF increases. The signal generator 622 may include a digital-analog converter configured to convert a binary value into an analog signal.

The test voltage generator 630 may generate a test voltage T_VOL having a fixed level during activation of the calibration signal CAL_EN.

The offset information generator 640 may generate offset information OFF, and change the value of the offset information OFF when the level of the test signal T_SIG reaches the second level during activation of the calibration signal CAL_EN. For this operation, the offset information generator 640 may receive the level information LV_INF and change the value of the offset information OFF when the level information LV_INF reaches the end value.

For example, when the offset information OFF is a multi-bit signal, the offset information generator 640 may first output '000' as the offset information OFF. Then, when the level information LV_INF reaches '111', the offset information generator 640 may change the offset information OFF to '001'. Similarly, after the level information LV_INF reaches '111', the offset information generator 640 may sequentially change the offset information OFF to '011' and '111'. Then, when the level information LV_INF reaches '111' and the offset information OFF is '111', the offset information generator 640 may change the offset information OFF to '000'.

For another example, when the offset information OFF is an analog signal, the offset information generator 640 may generate a first offset signal OFF_S1 having the lowest level and a second offset signal OFF_S2 having the highest level. After the level information LV_INF reaches '111', the offset information generator 640 may raise the level of the first offset signal OFF_S1 at a predetermined interval, and lower the level of the second offset signal OFF_S2 at a predetermined interval. When the level information LV_INF reaches '111' after the first offset signal OFF_S1 reaches the highest level and the second offset signal OFF_S2 reaches the lowest level, the offset information generator 640 may change the levels of the first and second offset signals OFF_S1 and OFF_S2 to the lowest level and the highest level, respectively.

The select signal generator 650 may generate a plurality of select signals SEL<0:N>, and activate one of the select signals SEL<0:N> in response to the offset information OFF. During activation of the calibration signal CAL_EN, the select signal generator 650 may first activate the first select signal SEL<0>. Furthermore, the select signal generator 650 may select another one of the plurality of select signals SEL<0:N> which is activated whenever the offset information OFF is initialized. For example, when the offset information OFF is changed from '111' to '000' when the first select signal SEL<0> is activated or the first offset signal OFF_S1 is changed from the highest level to the lowest level, the select signal generator 650 may deactivate the first select signal SEL<0> and activate the second select signal SEL<1>. The select signal generator 650 may sequentially activate the plurality of select signals SEL<0:N> according to the above-described method.

The detection signal generator 650 may receive an output OUT of the selected one of the data buffers 310_0 to 310_N, and activate a detection signal DET when the output OUT of the selected one of the data buffers 310_0 to 310_N transits and the test signal T_SIG reaches the target level. For this operation, the detection signal generator 660 may receive the output OUT of the selected one of the data buffers 310_0 to 310_N, and activate the detection signal DET when the output OUT of the selected one of the data buffers 310_0 to 310_N transits and the level information LV_INF has a value corresponding to the target level. For example, suppose that the target level is positioned between the levels 'LC' and 'LD' of the test signal T_SIG, and the values of the level information LV_INF corresponding to the levels 'LC' and 'LD' of the test signal T_SIG are '011' and '100'. The detection signal generator 660 may activate the detection signal DET when the value of the level information LV_INF is changed from '011' to '100' and the output OUT of the selected one of the data buffers 310_0 to 310_N transits from the low level L to the high level H. When the value of the level information LV_INF is not changed from '011' to '100' when the output OUT of the selected one of the data buffers 310_0 to 310_N transits, or when the level of the output OUT of the selected one of the data buffers 310_0 to 310_N does not transit, the detection signal generator 660 may not activate the detection signal DET.

The storage unit 670 may receive the offset information OFF and the select signal SEL<0:N> during activation of the calibration signal CAL_EN, and store the received offset information OFF as offset information corresponding to the activated select signal SEL<0:N> when the detection signal DET is activated. For example, when the detection signal DET is activated in a state where the select signal SEL<0> is activated, the storage unit 670 may store the received offset information OFF as offset information OFFS_0 corresponding to the first data buffer 310_0. The storage unit 670 may output the stored offset information OFFS_0 to OFFS_N when the calibration signal CAL_EN is deactivated.

For reference, the test signal generator 620 and the test voltage generator 630 may be used as a reference voltage generation circuit which generates a reference voltage VREF having a fixed level when the semiconductor device performs a general operation instead of the calibration operation.

Figure 7A:
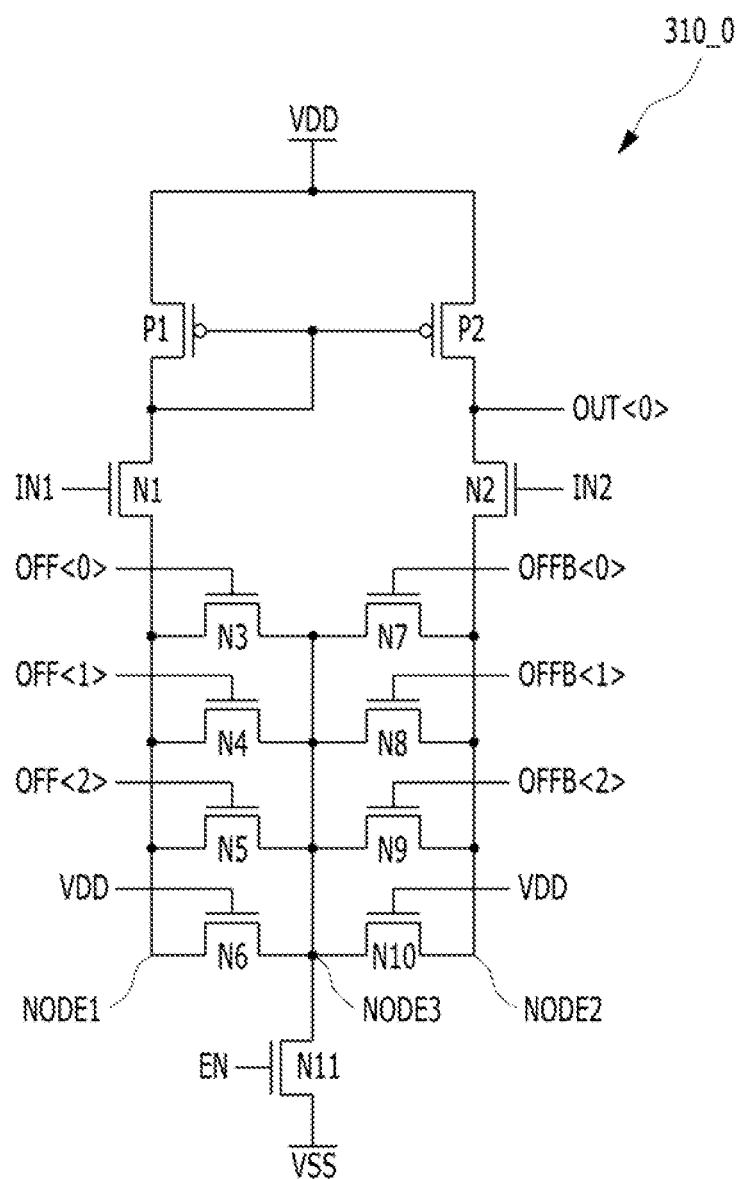
FIGS. 7A and 7B are circuit diagrams illustrating data buffers shown in FIG. 3.
Figure 7B:
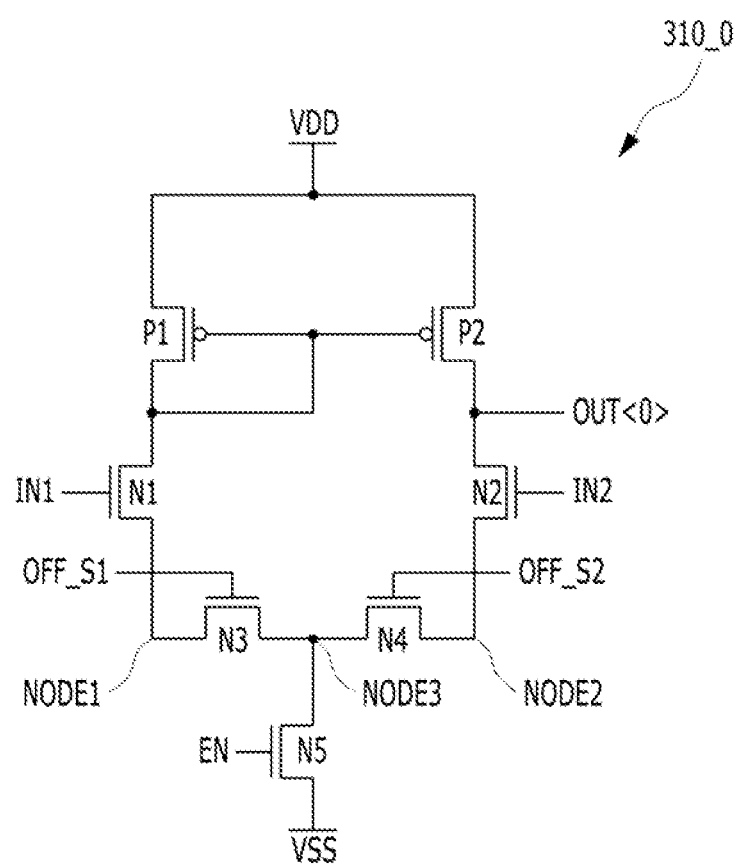

FIGS. 7A and 7B are circuit diagrams illustrating the data buffers 310_0 to 310_N shown in FIG. 3. FIG. 7A is a circuit diagram illustrating the data buffers 310_0 to 310_N when the offset information OFF is a multi-bit signal, and FIG. 7B is a circuit diagram illustrating the data buffers 310_0 to 310_N when the offset information OFF is an analog signal. FIGS. 7A and 7B exemplarily show the first data buffer 310_0 among the data buffers 310_0 to 310_N. The data buffers 310_0 to 310_N may be the same as one another.

As illustrated in FIG. 7A, the first data buffer 310_0 may include a plurality of transistors P1, P2, and N1 to N11. Hereafter, suppose that the offset information OFF is a multi-bit signal, for example, a three-bit signal OFF<0:2>. An offset signal OFFB<0:2> may be obtained by inverting the offset signal OFF<0:2>.

The transistors N3 to N5 may be turned on/off according to the bits of the offset signal OFF<0:2>, respectively, and the transistors N7 to N9 may be turned on/off according to the bits of the offset signal OFFB<0:2>, respectively. The transistors N3 to N5 may have different current drivabilities (transistor sizes), and the transistors N7 to N9 may have different current drivabilities (transistor sizes). The transistor N11 may enable the first data buffer 310_0 in response to the enable signal EN. The enable signal EN may be a clock signal. Hereafter, the operation of the first data buffer 310_0 when the enable signal EN is activated to enable the first data buffer 310_0 will be described.

First, when the value of the offset signal OFF<0:2> is '000', the value of the offset signal OFFB<0:2> may become '111'. Thus, since the transistors N3 to N5 are turned off and the transistors N7 to N9 are turned on, the first data buffer 310_0 may have the smallest offset. In this case, the first data buffer 310_0 may have a negative offset. Then, when the value of the offset signal OFF<0:2> is sequentially changed to '001', '011', and '111', the offset of the first data buffer 310_0 may gradually increase as the transistors N3, N4, and N5 are sequentially turned on and the transistors N7, N8, and N9 are sequentially turned off. That is because the offset decreases as a first drivability for driving a current from a node NODE1 to a node NODE3 becomes smaller than a second drivability for driving a current from a node NODE2 to the node NODE3, and increases as the first drivability becomes larger than the second drivability.

As illustrated in FIG. 7B, the first data buffer 310_0 may include a plurality of transistors P1, P2 and N1 to N5. Hereafter, suppose that the offset information OFF includes a first offset signal OFF_S1 and a second offset signal OFF_S2.

The transistor N3 may drive a current from a node NODE1 to a node NODE3 in response to the first offset signal OFF_S1, and the transistor N4 may drive a current from a node NODE2 to the node NODE3 in response to the second offset signal OFF_S2. The current drivabilities of the transistors N3 and N4 may increase when the levels of the first and second offset signals OFF_S1 and OFF_S2 increase, and decrease when the levels of the first and second offset signals OFF_S1 and OFF_S2 decrease. For reference, the transistor N5 may perform the same function as the transistor N11 described above with reference to FIG. 7A.

First, when the first offset signal OFF_S1 having the lowest level and the second offset signal OFF_S2 having the highest level are applied, the transistor N3 may have the lowest drivability, and the transistor N4 may have the highest drivability. Then, when the first offset signal OFF_S1 gradually increases and the second offset signal OFF_S2 gradually decreases, the drivability of the transistor N3 may be increased, and the drivability of the transistor N4 may be decreased. Thus, the offset of the first data buffer 310_0 may gradually increase from the lowest value.

Figure 8:
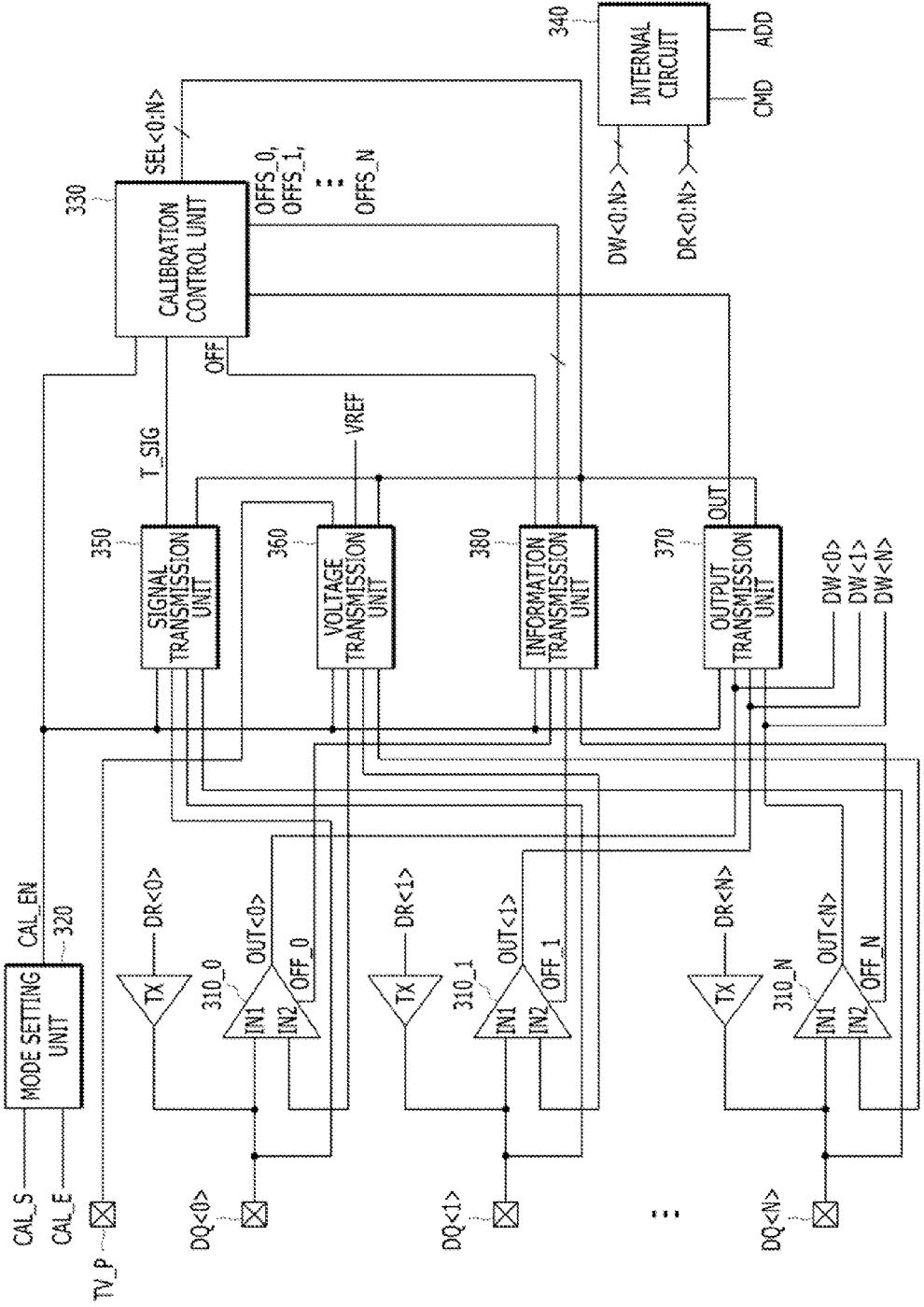
FIG. 8 is a block diagram illustrating a semiconductor device in accordance with another embodiment of the present invention.

FIG. 8 is a block diagram illustrating a semiconductor device in accordance with another embodiment of the present invention.

The semiconductor device shown in FIG. 8 may be the same as the semiconductor device described with reference to FIGS. 3 to 7B except that the calibration control unit 330 may receive a test voltage T_VOL having a fixed level during a calibration operation through a test voltage pad TV_P which is separately provided in the semiconductor device instead of generating the test voltage T_VOL. When the calibration signal CAL_EN is activated, the voltage transmission unit 360 may transmit the test voltage T_VOL inputted through the test voltage pad TV_P to the second input node IN2 of the selected one of the data buffers 310_0 to 310_N.

Figure 9:
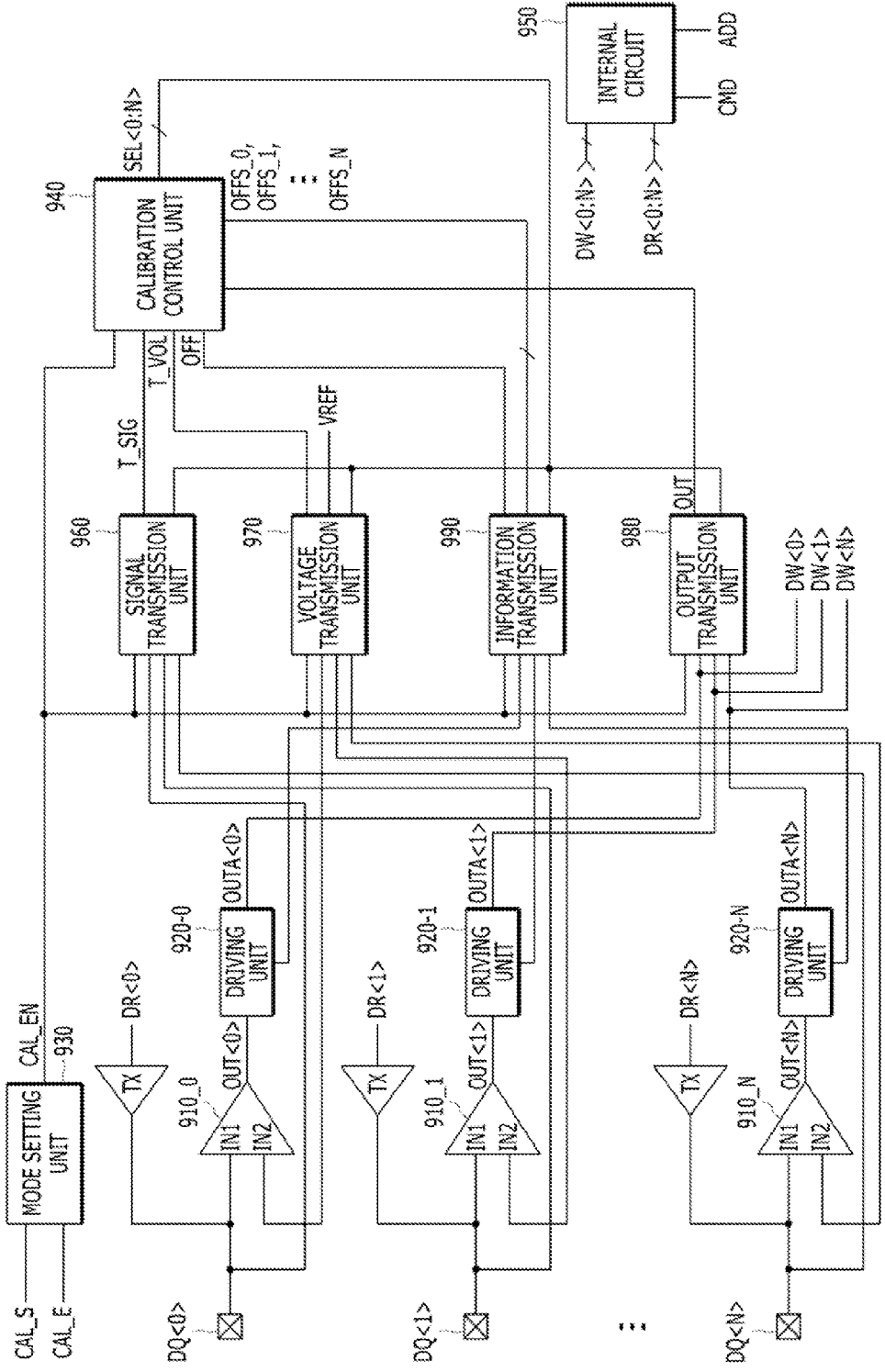
FIG. 9 is a block diagram illustrating a semiconductor device in accordance with another embodiment of the present invention.

FIG. 9 is a block diagram illustrating a semiconductor device in accordance with another embodiment of the present invention.

As illustrated in FIG. 9, the semiconductor device may include a plurality of data pads DQ<0:N>, a plurality of data buffers 910_0 to 910_N, a plurality of driving units 920_0 to 920_N, a mode setting unit 930, a calibration control unit 940, a plurality of transmitters TX, and an internal circuit 950. Furthermore, the semiconductor device may include a signal transmission unit 960, a voltage transmission unit 970, an output transmission unit 980, and an information transmission unit 990.

The semiconductor device shown in FIG. 9 may not directly adjust the offsets of the data buffers, but indirectly adjust the reference level using the drivabilities of driving units.

The plurality of data buffers 910_0 to 910_N, the mode setting unit 930, the plurality of transmitters TX, the internal circuit 950, the signal transmission unit 960, the voltage transmission unit 970, the output transmission unit 980, and the information transmission unit 990 shown in FIG. 9 may be the same as the plurality of data buffers 310_0 to 310_N, the mode setting unit 320, the plurality of transmitters TX, the internal circuit 340, the signal transmission unit 350, the voltage transmission unit 360, the output transmission unit 370, and the information transmission unit 380 described with reference to FIGS. 3 to 7B, respectively.

Referring to FIG. 9, the semiconductor device will be described.

The plurality of driving units 920_0 to 920_N may correspond to the respective data buffers 910_0 to 910_N, and pull-up or pull-down drive corresponding one of output nodes OUTA<0:N> in response to outputs OUT<0:N> of the corresponding one of the data buffers 910_0 to 910_N. For example, the driving units 920_0 to 920_N may pull-down drive the corresponding one of the output nodes OUTA<0:N> when the outputs OUT<0:N> of the corresponding one of the data buffers 910_0 to 910_N are high, and pull-up drive the corresponding one of the output nodes OUTA<0:N> when the outputs OUT<0:N> of the corresponding one of the data buffers 910_0 to 910_N are low.

The calibration control unit 940 may generate a test signal T_SIG and a test voltage T_VOL during a calibration period, receive signals of the output nodes OUTA<0:N> while adjusting the level of the test signal T_SIG, and adjust the drivabilities of the driving units 920_0 to 920_N such that the logical values of the signals of the output nodes OUTA<0:N> may transit when the test signal T_SIG has the target level. The drivabilities may include pull-up drivabilities of the driving units 920_0 to 920_N to pull-up drive the corresponding one of the output nodes OUTA<0:N> to a power supply voltage VDD, and pull-down drivabilities of the driving units 920_0 to 920_N to pull-down drive the corresponding one of the output nodes OUTA<0:N> to a ground voltage VSS.

The offset information OFF described with reference to FIGS. 3 to 7B may be used as information for adjusting the drivabilities of the driving units 920_0 to 920_N shown in FIG. 9. That is, the drivability information OFF shown in FIG. 9 may correspond to the offset information OFF described with reference to FIGS. 3 to 7B.

Figure 10A:
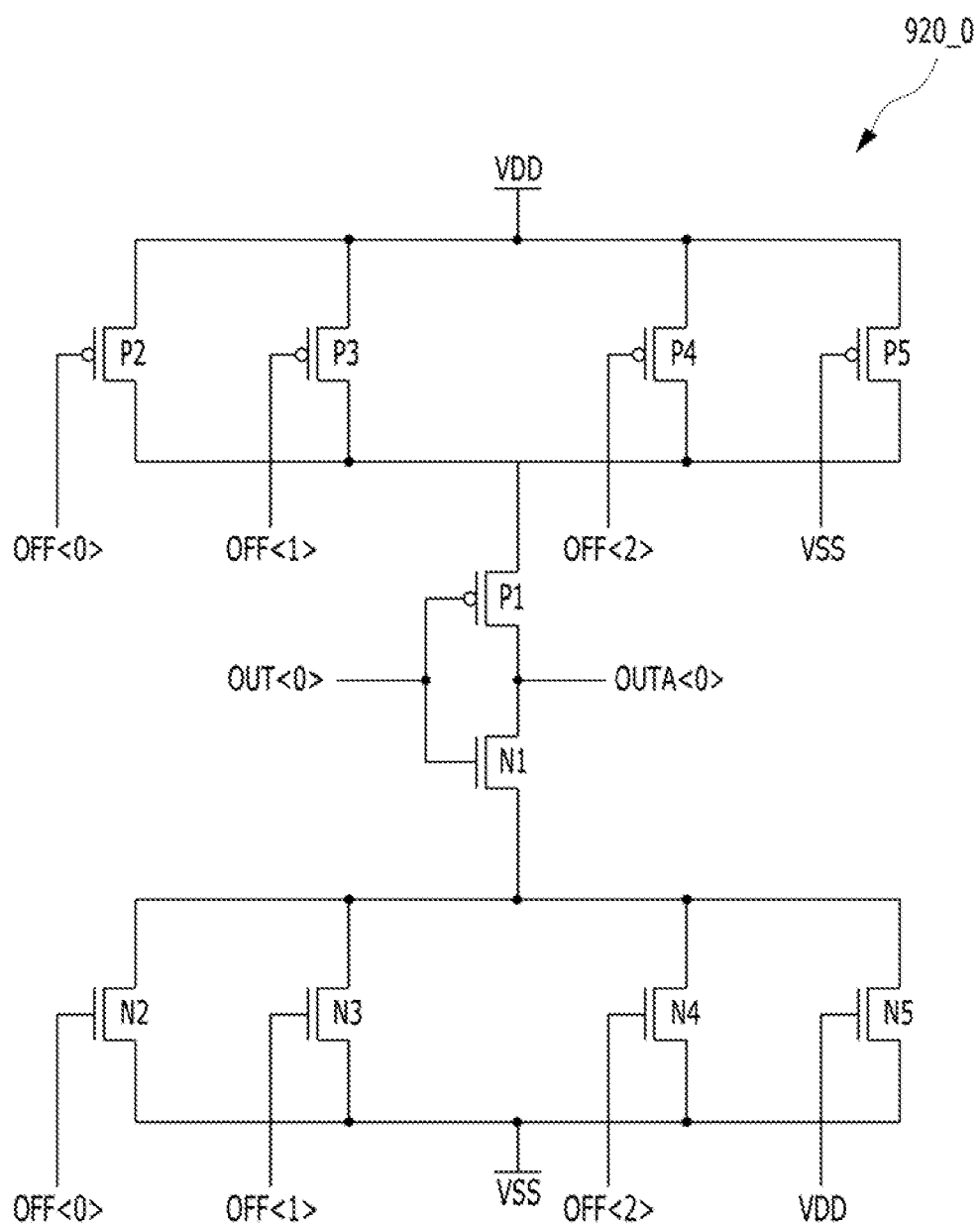
FIG. 10A is a circuit diagram illustrating driving units shown in FIG. 9.
Figure 10B:
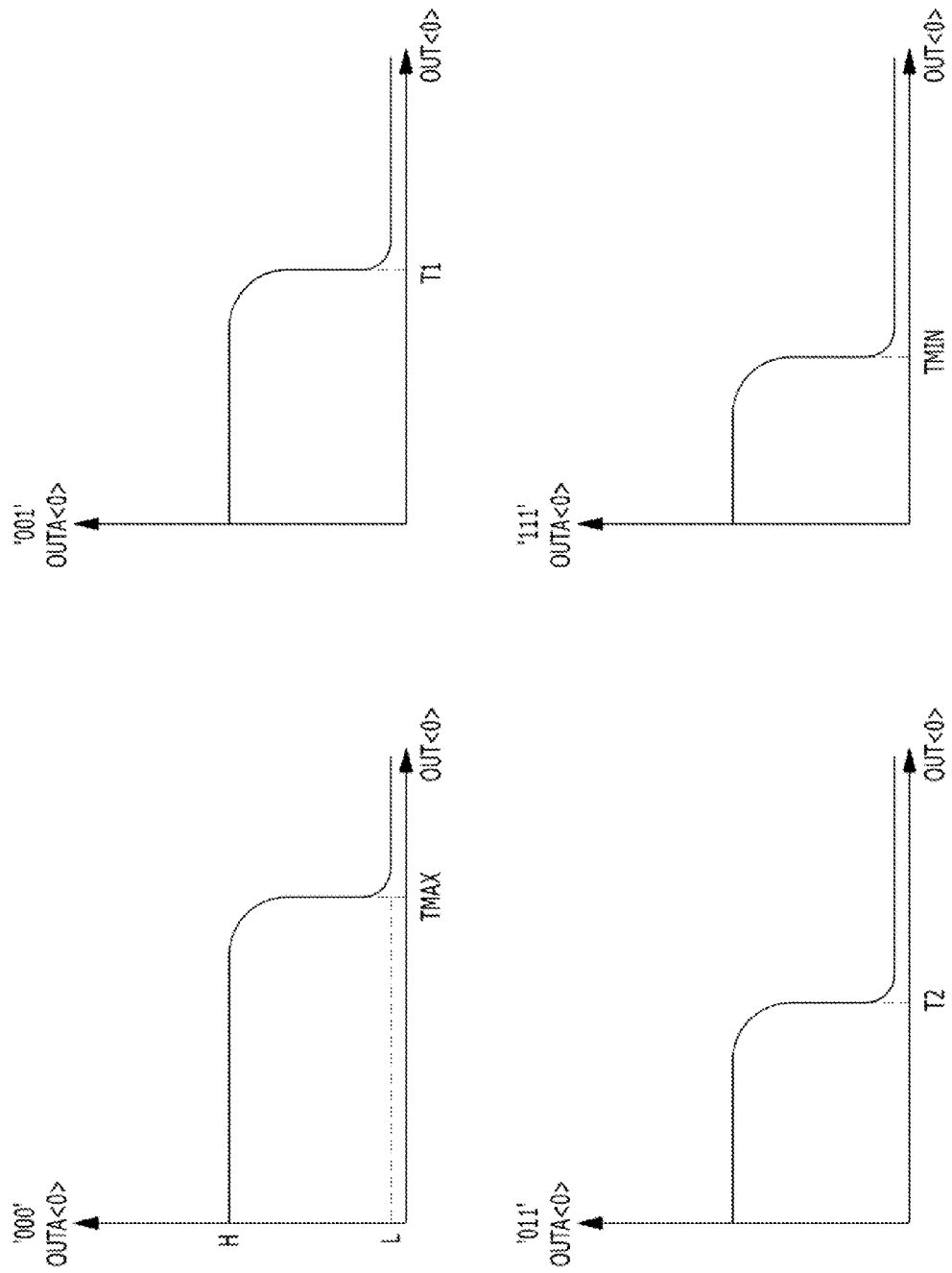
FIG. 10B is a diagram illustrating operations of driving units shown in FIG. 9.

FIG. 10A is a circuit diagram Illustrating the driving units 920_0 to 920_N shown in FIG. 9. FIG. 10B is a diagram illustrating operations of the driving units 920_0 to 920_N. FIGS. 10A and 10B exemplarily show the first driving unit 920_0 among the driving units 920_0 to 920_N. The driving units 920_0 to 920_N may be the same as one another. FIG. 10B shows the relationship between voltage levels of output OUT<0> and output node OUTA<0> of the first driving unit 920_0 according to the change in drivability of the first driving unit 920_0.

As illustrated in FIG. 10A, the first driving unit 920_0 may include a plurality of transistors N1 to N5 and P1 to P5. Hereafter, the case in which the drivability information OFF is a three-bit signal OFF<0:2> will be described.

The transistors N2 to N4 and the transistors P2 to P4 may be turned on/off in response to the respective bits of the drivability information OFF<0:2>. The transistors N2 to N4 may have different current drivabilities, and the transistor P2 to P4 may have different current drivabilities. When the drivability information OFF<0:2> is '000', all of the transistors N2 to N4 may be turned off, and all of the transistors P2 to P4 may be turned on. Thus, the pull-up drivability of the first driving unit 920_0 is the highest, and the pull-down drivability of the driving unit is the lowest.

Thus, as illustrated in FIG. 10B, when the drivability information OFF<0:2> is '000' and the level OUT<0> of the first driving unit 920_0 has the maximum value TMAX, the level of the output node OUTA<0> of the first driving unit 920_0 transits from the high level H to the low level L. Then, as the drivability information OFF<0:2> is changed to '001', '011', and '111', the pull-up drivability of the driving unit decreases, and the pull-down drivability of the driving unit increases. Thus, as the drivability information OFF<0:2> is changed to '001', '011', and '111', the level OUT<0> of the first driving unit 920_0, at which the level of the output node OUTA<0> of the first driving unit 920_0 transits from the high level H to the low level L, may gradually decrease to sequentially have T1, T2, and the minimum value TMIN. That is, the level OUT<0> of the first driving unit 920_0 may be changed in order of TMAX, T1, T2, and TMIN as the drivability information OFF<0:2> is changed in order of '000', '001', '011', and '111'.

According to such characteristics, when the reference level of a corresponding buffer is relatively high (for example, the corresponding buffer has a positive offset when the target offset is zero), the pull-up drivability of the driving unit may be lowered and the pull-down drivability of the driving unit may be raised, in order to compensate for the offset. When the reference level of the corresponding buffer is relatively low (for example, the corresponding buffer has a negative offset when the target offset is zero), the pull-up drivability of the driving unit may be raised and the pull-down drivability of the driving unit may be lowered, in order to compensate for the offset.

Figure 11:
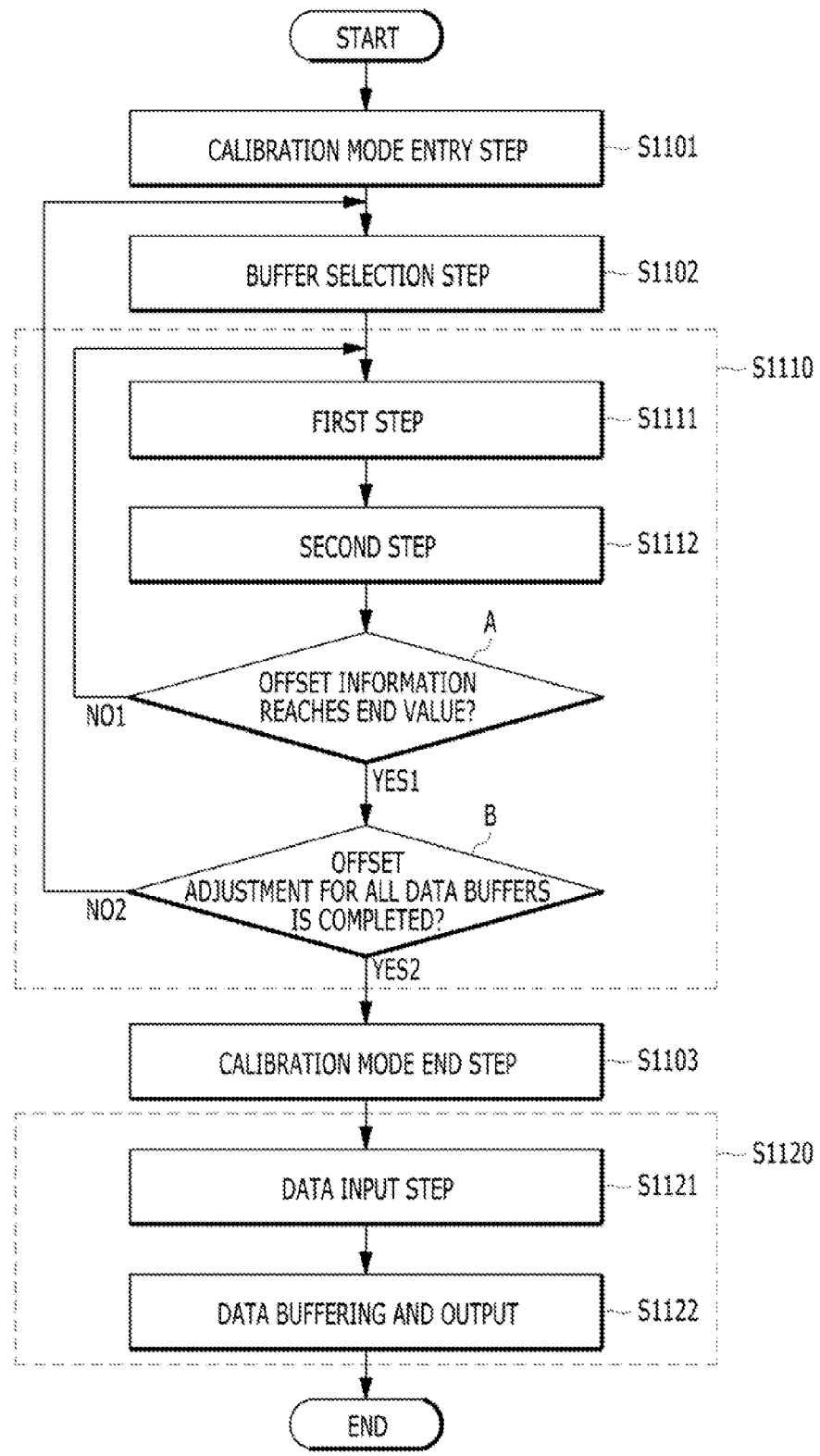
FIG. 11 is a flowchart illustrating a method for operating the semiconductor device shown in FIGS. 3 and 8.

FIG. 11 is a flowchart illustrating a method for operating the semiconductor device shown in FIGS. 3 and 8.

As illustrated in FIG. 11, the method for operating the semiconductor device may include an offset adjusting step S1110 and a data buffering step S1120.

Referring to FIGS. 3 to 8 and 11, the method for operating the semiconductor device will be described. After the operation of the semiconductor device is started, the semiconductor device may enter the calibration mode at step S1101. In the calibration mode, the semiconductor device may select one of the data buffers, of which the offset is to be adjusted, at step S1102. When one of the data buffers is selected, the semiconductor device may perform the offset adjusting step S1110. The offset adjusting step S1110 may include a first step S1111 of setting or changing offset information OFF and applying the offset information OFF to the selected data buffer, and a second step S1112 of sequentially changing the level of the test signal T_SIG at a predetermined interval from the first level L1 to the second level L2 in a state where the offset of the selected data buffer is set by the applied offset information OFF. At this time, the offset information OFF may have an initial value (for example, '000') at first, and may be changed up to the end value (for example, '111').

When the second step S1112 is completed, the semiconductor device may determine whether the offset information OFF reaches the end value (A). When the offset information OFF does not reach the end value (NO1), the semiconductor device may perform the first step S1111 to change the offset information OFF, and the second step S1112. When the offset information OFF reaches the end value (YES1), the semiconductor device may determine whether the offset adjustment for all the data buffers is completed (B). When the offset adjustment for all the data buffers is not completed (NO2), the semiconductor device may select another one of the data buffers, of which the offset is to be adjusted, at step S1102.

When the offset adjustment for all the data buffers is completed (YES2), the semiconductor device may end the calibration mode at step S1103. At this time, when the logical value of the output of the selected data buffer transits in when the test signal T_SIG has the target level at the second step S1112, the offset information OFF may be stored.

When the calibration is completed, the semiconductor device may receive data through the plurality of data pads DQ<0:N> at step S1121, and the plurality of data buffers 310_0 to 310_N may receive the data of the corresponding data pads through the first input nodes IN1, receive the reference voltage VREF through the second input nodes IN2, and buffer and output the data of the corresponding data pads at step S1122.

Figure 12:
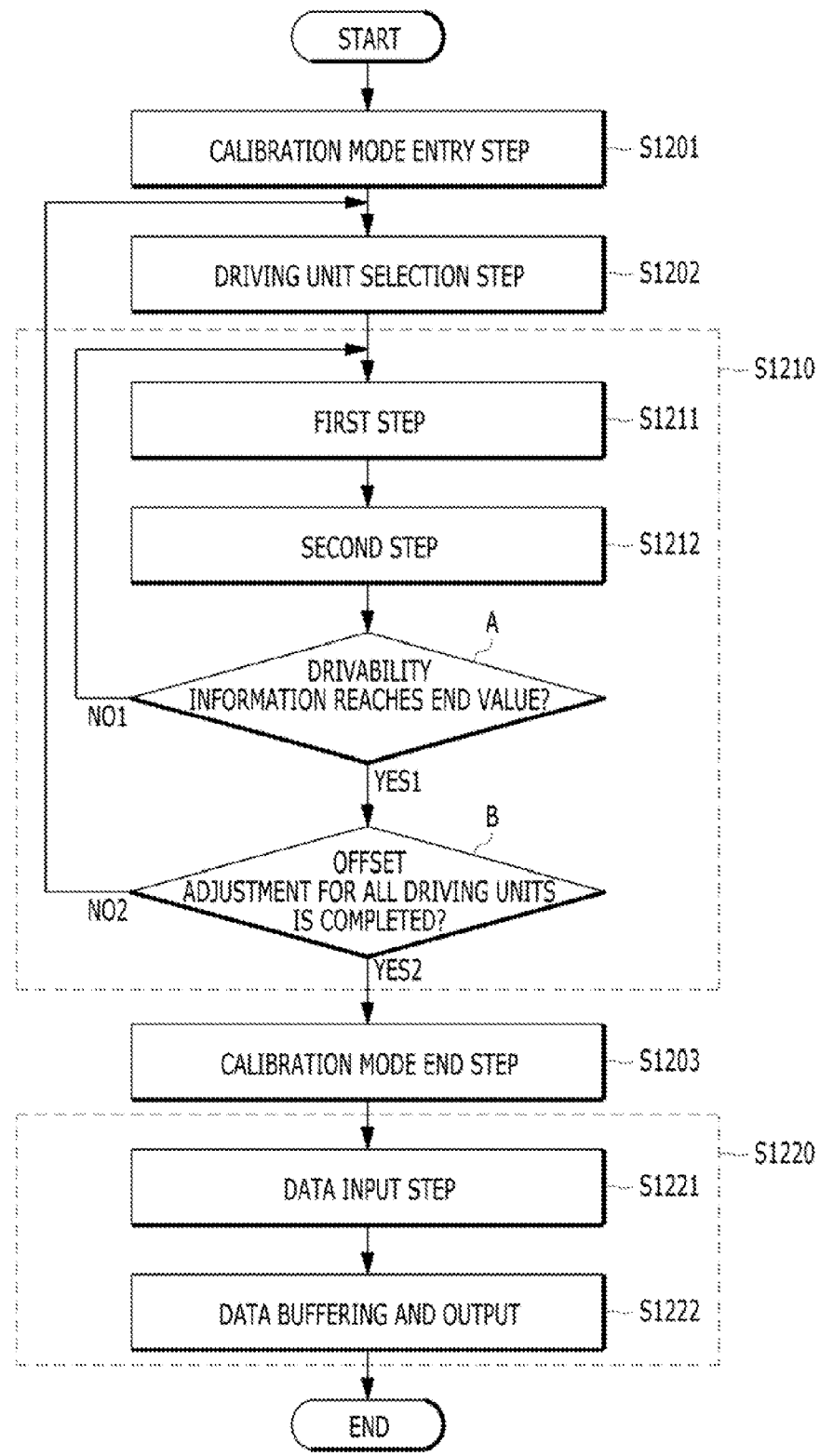
FIG. 12 is a flowchart illustrating a method for operating the semiconductor device shown in FIG. 9.

FIG. 12 is a flowchart illustrating a method for operating the semiconductor device shown in FIG. 9.

As illustrated in FIG. 12, the method for operating the semiconductor device may include a drivability adjusting step S1210 and a data buffering step S1220.

Referring to FIGS. 9 and 12, the method for operating the semiconductor device will be described. After the operation of the semiconductor device is started, the semiconductor device may enter the calibration mode at step S1201. In the calibration mode, the semiconductor device may select one of the driving units, of which the drivability is to be adjusted, at step S1202. When one of the driving units is selected, the semiconductor device may perform the drivability adjusting step S1210. The drivability adjusting step S1210 may include a first step S1211 of setting or changing drivability information OFF and applying the drivability information OFF to the selected driving unit, and a second step S1212 of sequentially changing the level of the test signal T_SIG at a predetermined interval from the first level L1 to the second level L2 in a state where the drivability of the selected driving unit is set by the applied drivability information OFF. The drivability information OFF may have an initial value (for example, '000') at first, and may be changed up to the end value (for example, '111').

When the second step S1212 is completed, the semiconductor device may determine whether the drivability information OFF reaches the end value (A). When the drivability information OFF does not reach the end value (NO1), the semiconductor device may perform the first step S1211 to change the drivability information OFF, and the second step S1212. When the drivability information OFF reaches the end value (YES1), the semiconductor device may determine whether the offset adjustment for all the driving units is completed (B). When the offset adjustment for all the driving units is not completed (NO2), the semiconductor device may select another one of the driving units, of which the drivability is to be adjusted, at step S1202. When the offset adjustment for all the driving units is completed (YES2), the semiconductor device may end the calibration mode at step S1203. When the logical value of the output node of the selected driving unit transits when the test signal T_SIG has the target level at the second step S1212, the drivability information OFF may be stored.

When the calibration is completed, the semiconductor device may receive data through the plurality of data pads DQ<0:N> at step S1221, and the plurality of data buffers 910_0 to 910_N may receive the data of the corresponding data pads through the first input nodes IN1, receive the reference voltage VREF through the second input nodes IN2, and buffer and output the data of the corresponding data pads at step S1222. The plurality of driving units 920_0 to 920_N may drive the corresponding output nodes OUTA<0:N> in response to the outputs OUT<0:N> of the corresponding data buffers 910_0 to 910_N at step S1223.

In the above embodiments, it has been described that the semiconductor device selects one data buffer (or driving unit) among the plurality of data buffers (or the plurality of driving units) and adjusts the offset (or drivability) of the selected data buffer (or the selected driving unit). However, depending on the design of the calibration control unit, the semiconductor device may select one or more data buffers (or driving units) to adjust offsets (or drivabilities) of the one or more data buffers (or driving units) simultaneously. Furthermore, the offsets (or drivabilities) of all of the data buffers (or driving units) may be adjusted at once.

In accordance with the embodiments of the present invention, the semiconductor device may adjust the offsets of the plurality of data buffers such that the data buffers have the same reference level, and receive data using the adjusted offsets, thereby maximizing the margin of data inputted to the semiconductor device.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a plurality of data pads; a plurality of data buffers each suitable for buffering a signal inputted through a first input node using a voltage inputted through a second input node, and outputting the buffered signal; and
   a calibration control unit suitable for generating a test signal in a calibration mode, adjusting the level of the test signal, receiving outputs of the plurality of data buffers while adjusting the level of the test signal, and adjusting offsets of the data buffers such that the logical values of the outputs of the data buffers transit when the test signal has a target level,
   wherein data of the corresponding data pad is inputted to the first input node, and a reference voltage is inputted to the second input node, and
   in the calibration mode, the test signal is inputted to the first input node, and a test voltage is applied to the second input node.

2. The semiconductor device of claim 1, wherein the offset corresponds to a difference between the level of the voltage inputted to the second input node and the level of the signal inputted to the first input node when the logical value of the output of the data buffer transits.

3. The semiconductor device of claim 2, wherein, in the calibration mode, the calibration control unit adjusts the offset, sequentially changes the level of the test signal at a predetermined interval from a first level to a second level whenever the offset is changed, receives the output of the data buffer, and detects the offset at which the logical value of the output of the data buffer transits when the test signal has the target level.

4. The semiconductor device of claim 2, wherein the offsets of the plurality of data buffers are adjusted in response to offset information.

5. The semiconductor device of claim 4, wherein, in the calibration mode, the calibration control unit sequentially changes the offset information, sequentially changes the level of the test signal at a predetermined interval from a first level to a second level whenever the offset is changed, receives the output of the data buffer, and detects the offset information at which the logical value of the output of the data buffer transits when the test signal has the target signal.

6. The semiconductor device of claim 5, wherein the calibration control unit comprises:
   a change signal generator suitable for generating a change signal which is periodically activated in the calibration mode;
   a test signal generator suitable for generating the test signal of which the level is sequentially changed at a predetermined interval from the first level to the second level whenever the change signal is activated, wherein the test signal generator changes the level of the test signal from the first level to the second level whenever the test signal reaches the second level;
   a test voltage generator suitable for generating the test voltage having a fixed level;
   an offset information generator suitable for generating the offset information, and changing the value of the offset information when the test signal reaches the second level;
   a detection signal generator suitable for receiving the output of the data buffer and activating a detection signal when the logical value of the output of the data buffer transits when the test signal has the target level; and
   a storage unit suitable for storing the offset information when the detection signal is activated.

7. The semiconductor device of claim 1, further comprising a test voltage pad suitable for receiving the test voltage in the calibration mode.

8. A method for operating a semiconductor device which includes a plurality of data buffers, comprising:
   inputting a test signal to first input nodes of the plurality of data buffers, inputting a test voltage to second input nodes of the data buffers, adjusting the level of the test signal, receiving outputs of the data buffers, and adjusting offsets of the data buffers such that the logical values of the outputs of the data buffers transit when the test signal has a target level; and
   receiving data through the plurality of data pads; and inputting data of the corresponding data pads to the first input nodes of the data buffers, inputting a reference voltage to the second input nodes of the data buffers, and buffering the data using the reference voltage.

9. The method of claim 8, wherein the offset corresponds to a difference between the level of the voltage inputted to the second input node and the level of the signal inputted to the first input node when the logical value of the output of the data buffer transits.

10. The method of claim 8, wherein the adjusting of the offsets comprises:
    changing the offset;
    changing the level of the test signal at a predetermined interval from a first level to a second level; and
    repeating the changing of the offset and the changing of the level of the test signal.

11. The method of claim 10, wherein in the adjusting of the offsets stores the offset when the logical value of the output of the data buffer transits when the test signal has the target level at the changing of the level of the test signal.

12. A method for operating a semiconductor device which includes a plurality of data buffers and a plurality of driving units suitable for pull-up driving or pull-down driving output nodes of the plurality of data buffers in response to outputs of the plurality of data buffers, respectively, the method comprising:
   inputting a test signal to first input nodes of the plurality of data buffers, inputting a test voltage to second input nodes of the data buffers, adjusting the level of the test signal, receiving voltages of the output nodes of the data buffers, and adjusting drivabilities of the plurality of driving units such that the logical values of voltages of the output nodes of the data buffers transit when the test signal has a target level;

receiving data through the plurality of data pads;

inputting data of the corresponding data pads to the first input nodes of the data buffers, inputting a reference voltage to the second input nodes of the data buffers, and buffering the data using the reference voltage; and driving the output nodes of the data buffers in response to outputs of the data buffers, respectively.

13. The method of claim 12, wherein the drivability of each of the plurality of driving units comprises pull-up drivability of the driving unit to pull-up drive the output node of a corresponding buffer of the plurality of data buffers, and pull-down drivability of the driving unit to pull-down drive the output node of the corresponding buffer of the plurality of data buffers.

14. The method of claim 12, wherein the adjusting of the drivabilities comprises:

changing the drivability;

sequentially changing the level of the test signal at a predetermined interval from a first level to a second level; and repeating the changing of the offset and the sequentially changing of the level of the test signal.

15. The method of claim 14, wherein the adjusting of the drivabilities stores the drivability when the logical value of the output of the output node of the data buffer transits and the test signal has the target level at the changing of the level of the test signal.

* * * * *